United States Patent [19]

Koslov

[11] Patent Number: 5,748,043
[45] Date of Patent: May 5, 1998

[54] DIGITAL PLL FREQUENCY SYNTHESIZER

[76] Inventor: Vitali Ivanovich Koslov, Flat 3, 28 Radvanskov Ukraini Avenue, Kiev, Ukraine, 254215

[21] Appl. No.: 737,351
[22] PCT Filed: May 3, 1994
[86] PCT No.: PCT/US94/04880
  § 371 Date: Nov. 1, 1996
  § 102(e) Date: Nov. 1, 1996
[87] PCT Pub. No.: WO95/30202
  PCT Pub. Date: Nov. 9, 1995
[51] Int. Cl.⁶ .................. H03L 7/085; H03L 7/18
[52] U.S. Cl. ............... 331/1 A; 331/27; 327/7; 327/159
[58] Field of Search .............. 331/25, 27, 1 A; 327/7, 159

[56] References Cited

U.S. PATENT DOCUMENTS

| | | | |
|---|---|---|---|
| 3,913,028 | 10/1975 | Bosselaers | 331/1 A |
| 4,144,579 | 3/1979 | Nossen et al. | 327/105 |
| 5,008,629 | 4/1991 | Ohba et al. | 331/1 A |
| 5,019,785 | 5/1991 | Fognini et al. | 331/1 R |

FOREIGN PATENT DOCUMENTS

B3B-07310  12/1993  Ukraine .

OTHER PUBLICATIONS

"Frequency Synthesizer on the Base of Summing Accumulators", Elektrocvyaz, Issue #2, 1988, pp. 53–56.

*Primary Examiner*—Siegfried H. Grimm
*Attorney, Agent, or Firm*—David P. Gordon; Thomas A. Gallagher

[57] ABSTRACT

A digital frequency synthesizer includes a digital-to-analog (1), a low pass filter (2), and a controllable oscillator (3), where the oscillator output is the synthesizer output. K number of RS flip-flops (101–108) produce error signals which are coupled to the DAC. The S inputs of the flip-flops come from a phase-splitter (8) which is driven by the more-significant bits unit of an accumulator (5) which is clocked by a reference frequency. The R inputs of the same flip-flops get input pulses from a pulse distributor (9) which is driven by the synthesizer output. The frequency resolution can be increased by adding a less-significant bits accumulator (15), coupled to the more-significant bits unit.

19 Claims, 10 Drawing Sheets

DIGITAL PLL FREQUENCY SYNTHESIZER

BACKGROUND OF THE INVENTION

1. Field of the Invention

This invention relates to frequency synthesizers and, in particular, to digital frequency synthesizers using a phase locked loop (PLL) to produce a signal having a frequency $f_s$ which is a rational fraction of a reference frequency $f_r$ according to the relationship:

$$f_s = (a/b) \cdot f_r \qquad (1)$$

where a and b are positive integers. Synthesizers of this kind are useful in variety of applications including, but not limited to, telecommunications systems and radio measurement equipment.

2. State of the Art

A known digital frequency synthesizer is disclosed in U.S. Pat. No. 3,913,028 to Bosselaers. This known synthesizer uses an oscillator, as part of a PLL, controlled by a signal from an arithmetic unit, combined with a digital-to-analog converter (DAC), and a low-pass filter. This architecture permits a high speed of operation and high resolution in frequency, but lacks the spectral purity of output signal required in many cases. Modern telecommunications and radio measurement equipment require frequency synthesizers which have a high spectral purity of output in addition to a high speed of operation and high resolution in frequency.

A series of advanced frequency synthesizers providing a signal of better spectral purity are disclosed in Kozlov, V. I., *Frequency Synthesizers Based on Using Accumulators*, Electrosvyaz, 1988, No.2, pp. 53–56 (the English translation of this magazine is published in the U.S.A. by Scripta Publishing Company, under the title, "Telecommunications and Radio Engineering"). These synthesizers are based on a digital phase demodulation of two pulse trains, reference and controllable, having different frequencies, and utilize accumulators, an RS flip-flop and a DAC. The result of phase comparison of these two pulse trains is fed from the DAC, via a low-pass filter, to a controllable oscillator whose output is adjusted by the PLL to whatever relationship with the reference frequency is required. The desired signal frequency is determined by code-setting of the inputs to the accumulators. The improvement in signal spectral purity, gained in this way, is not enough, however. The signal spectrum still contains some discrete components, which may be called fractional spurs, because the frequencies of the reference signal and output pulse trains are not in integer relationship with each other. The level of these fractional spurs depends on the accuracy of the DAC which, in turn, is limited by the current technological state of the art. For example, using an 8-bit DAC, the level of fractional spurs is typically no less than −48 dBc. In many cases, this level of fractional spurs is unacceptable. The problem of minimizing these spurs is still a prime concern in the design of frequency synthesizers.

SUMMARY OF THE INVENTION

It is therefore an object of the invention to provide a frequency synthesizer utilizing a DAC where the spectral purity of the output signal is improved over the current art for a DAC of given accuracy.

It is also an object of the invention to provide a frequency synthesizer which has a high speed of operation and a high resolution in frequency.

In accord with these objects which will be discussed in detail below, the synthesizer of the present invention includes a DAC with its analog output coupled to a low-pass filter which, in turn, is coupled to a controlled oscillator (VCO) whose output is the output of the synthesizer. A frequency to be synthesized is selected by a binary number which is input to a first accumulator. The outputs of the first accumulator are fed through a phase splitter having K outputs (where $K=2^k$ and k is the number of the accumulator's bits) which are each coupled to the S input of a respective RS flip-flop. The output of each of the flip-flops is coupled to first equally weighted inputs of the DAC. A reference frequency serves as the clock input for the accumulator and the phase splitter. The output signal of the VCO is coupled to the clock input of a pulse distributor having w outputs each of which is coupled to the R input of a respective number (K/w) of the RS flip-flops (where K/w is an integer).

According to the invention, all of the DAC bits supplied by the RS flip-flops have equal weight. Therefore, to get the same level of the fractional spurs, the amplitude accuracy required of them, may be K times lower than in the known synthesizers. That means that given the same accuracy of DAC, the level of the fractional spurs will be K times lower. The time matching required of the DAC bits can be less severe since, in this case, time mismatching increases only higher-frequency fractional interferences which may be filtered out by the PLL. The DAC can be based on a KR-type resistive ladder.

In one embodiment, the pulse distributor is a ring counter, which greatly simplifies the synthesizer. In this embodiment, output signal frequency $f_s$ is determined according to the equation $$f_s = w \cdot x \cdot f_r / q, \qquad (2)$$

where w is the ring counter capacity, x is the input number to accumulator, q is the capacity of accumulator, and $f_r$ is the reference (clock) frequency.

If there is a need to use a relatively small value of w, several times less than q, then all RS flip-flops should be subdivided into w number of batches, with K/w flip-flops in each batch. In each batch, all R inputs of the flip-flops are connected to a corresponding output of the ring counter. This permits the value of w to be chosen from among a wide range of values.

The first accumulator can be supplemented with m number of less significant bits. This decreases the step size due to the increased full capacity of the accumulator, thereby increasing frequency resolution $\Delta f$ according to the equation:

$$\Delta f = f_r / q \qquad (3)$$

where the accumulator's full capacity $q=2^n$, with $n=k+m$. This gives rise to an interference having a maximum period of $2^m$ times the reference period, where m is the number of less-significant bits added. If the value of m is relatively small, the minimum interfering frequency is sufficiently high to be filtered out by PLL action. Otherwise, some way of suppressing this interference has to be found.

To suppress the interferences in this latter case, the output of the group of less-significant bits is connected to a second input of the DAC, whose less significant bits may be built using an R-2R type resistive ladder. These less significant bits are added to the more significant bits with the aid of a matching resistor; e.g., since their weight is 1/K of the full scale output signal of the DAC, the accuracy demanded of the most significant bit of them has the same low value as for each of the more significant bits, and for the less significant bits, accuracy demanded is even lower, correspondingly.

3

For the above-described embodiments of the invention, the frequency resolution can be made as high as desired by increasing full capacity of the accumulator. But, in these cases, the frequency step size and the reference frequency cannot be chosen independently, to make both convenient, e.g. for decimal steps, which is, in some cases, desirable or necessary. However, the choice of frequency step size can be enhanced by implementing the pulse distributor as a unit containing a second accumulator and a second phase splitter, the clock inputs of both being connected to the output of the synthesizer. Data input to the second accumulator is connected to a second data bus, which serves to code set the frequency step size. Implementing the equation, $f_s=(a/b) \cdot f_r$, the signal frequency $f_s$ is set by the code number a applied to the input of the first accumulator, and the frequency step size $\Delta f = f_r/b$ is code-set by number b at the input of the second accumulator. If a smaller step size is desired, a group of the less significant bits may be added as explained above with reference to the first accumulator. That is, the LSB output of the second accumulator can be connected to a third input of the DAC, which in this case, can be implemented by using an added R-4R/2 type resistive ladder.

Each of the two identical phase splitters contains a binary code to linear code transcoder, the number of units in the linear code being equal to the current value of the binary code at the output of its corresponding accumulator. The phase splitter also contains K number of chains, each chain containing a D flip-flop, a first AND gate, a multiplexer, and a second AND gate. Each of these chains is connected to a corresponding output of the transcoder. All of the D flip-flop clock inputs, and one of the inputs of the second AND gate are connected to a common clock input of the phase splitter. The controlling input to the multiplexer is connected to an output of overflow pulses, which is incorporated in the output bus of the corresponding accumulator; and one of the inputs of the first AND gate is connected to the data input of the D flip-flop, which input also serves as the input to the chain. In each of the K/2 chains, corresponding to less significant bits, another input to the multiplexer is connected to the input of the chain, and, in the K/2 chains remaining, a multiplexer input is connected to the output of the D flip-flop.

In order to further reduce demands on DAC accuracy, each of the less significant bits portions of the first and second accumulators are provided with an averaging unit which is clocked by reference or output signal pulses accordingly. Each of these averaging units may include an averaging accumulator having a capacity which is p bits more than the respective first or second accumulator and a register which is clocked by pulses having a frequency 2P times lower with the aid of a frequency divider. In this way, the frequency of switching in less significant bits of the DAC can be reduced to the frequency of switching in the more significant bits. This allows the use of a less accurate (slower acting) DAC or improves the spectral purity even further using a DAC of comparable accuracy.

This invention improves the spectral purity of a frequency synthesizer output signal without imposing severe demands on DAC accuracy. For example, known frequency synthesizers using DACs with an accuracy of an 8-bit device typically provide a level of fractional spurs of no less than −48 dBc. In a synthesizer according to the invention, these spurs can be lowered to −90 dBc or less, using a DAC of the same accuracy. Additional objects and advantages of the invention will become apparent to those skilled in the art upon reference to the detailed description taken in conjunction with the provided figures.

4

DETAILED DESCRIPTION OF THE PREFERRED EMBODIMENTS

Figure 1:
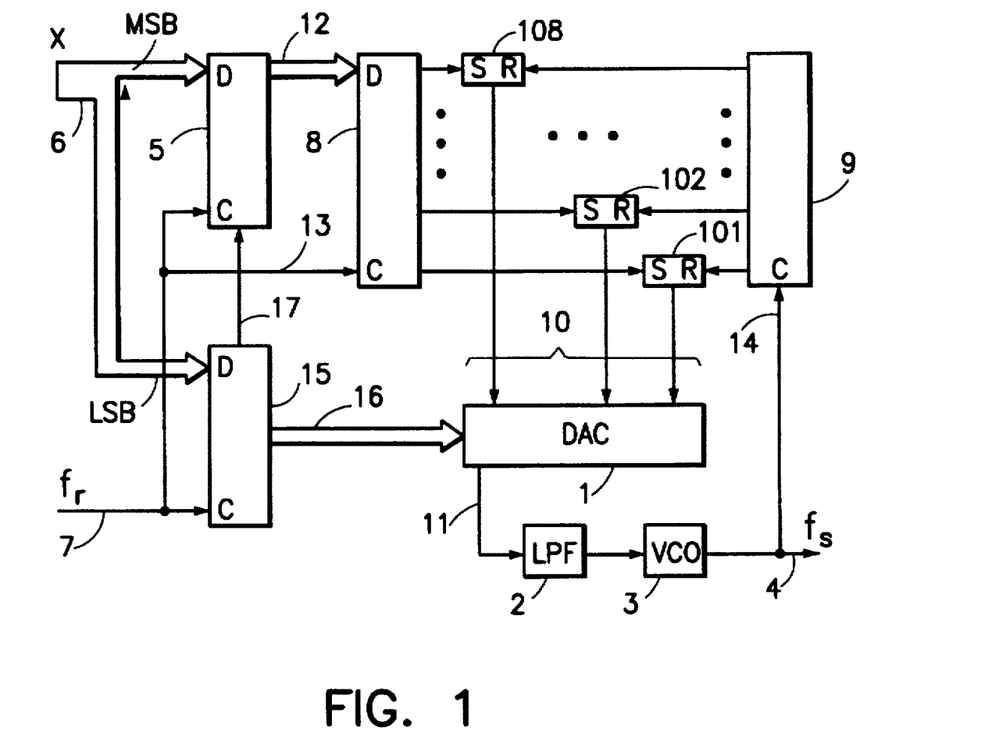
FIG. 1 is a block diagram of a first embodiment of the frequency synthesizer according to the invention.

A first embodiment of the invention is shown schematically in FIG. 1. According to this embodiment, an accumulator is shown by units 5 and 15, of more significant and less significant bits, respectively, connected to each other by carry network 17. Data inputs of the units are connected to a first data bus 6, which gets a number X, determining the synthesizer frequency. A first phase splitter 8, which is described in more detail below, has a data input 12 which receives a variable code number from the output of accumulator unit 5. Reference frequency pulses $f_r$ are supplied to a reference input 7 of the frequency synthesizer, and are coupled via a clock bus 13 to the clock inputs C of the accumulator units 5, 15 and the first phase splitter 8. The outputs of the phase splitter 8 are each coupled to the S input of a respective RS flip-flop, e.g. 101 through 108, and the output of each flip-flop is coupled to an equally weighted digital input 10 of a DAC 1. The analog output 11 of DAC 1 is coupled to a low pass filter 2 which in turn provides input for a controllable oscillator 3. The output 4 of the oscillator 3 is the synthesizer output, but is also coupled via a clock bus 14 to the clock input C of a pulse distributor 9 which is described in more detail below. The outputs of the pulse distributor 9 are coupled to respective R inputs of the RS flip-flops 101–108. The DAC 1, low pass filter 2, controllable oscillator 3, pulse distributor 9, and flip-flops 101–108 together form a phase locked loop. The RS flip-flops and the DAC together serve as a phase-sensitive demodulator, whose output signal is used to control the controllable oscillator 3.

Figure 2A:
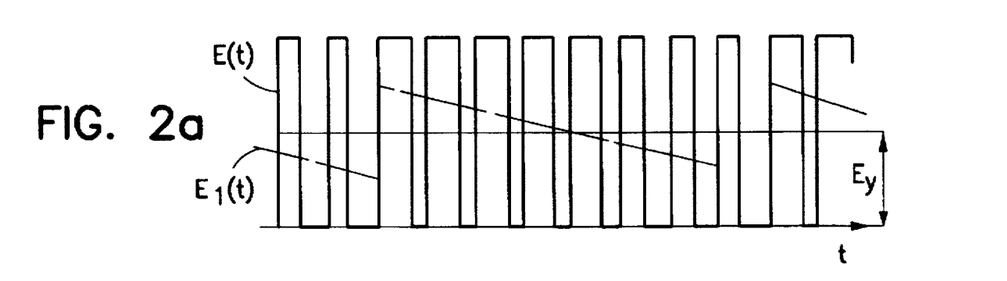
FIGS. 2a through 2g are timing diagrams illustrating the basic principles of operation of the first embodiment of the invention.
Figure 2B:
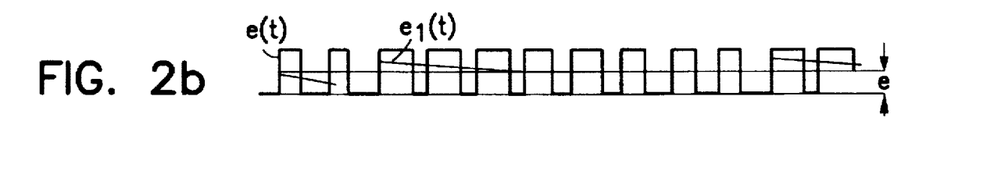
Figure 2C:
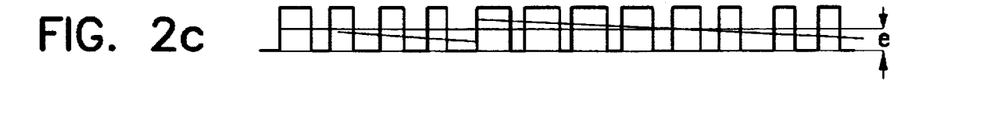
Figure 2D:
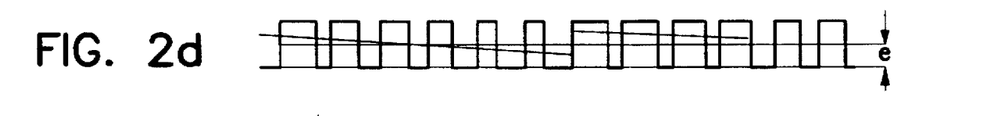
Figure 2E:
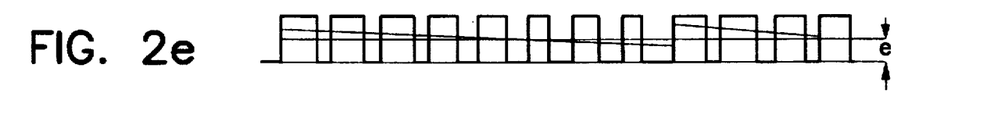

Turning now to FIGS. 2a through 2g and with reference to FIG. 1, the principle of operation of the synthesizer of the invention is illustrated in a simplified case using four RS flip-flops. If the number X on the first data bus 6 is not in integer relationship with the capacity q of the accumulator, the pulse signal E(t), as shown in FIG. 2a, which is the output of a single flip-flop in a known synthesizer, is contaminated by fractional interferences, which modulate a duty cycle of the process signal E(t). The largest period of these interferences equals q periods. See, for example, the averaged value $E_j(t)$ of the process signal E(t). It will be appreciated that there are K number of signals like E(t), one for each flip-flop. FIGS. 2b through 2e show the individual signals e(t) of four flip-flops which are shifted with respect to each other by the phase splitter 8. Each of these signals is shifted by M number of periods where M=q/K, K being the capacity of the more significant bits unit 5 of the accumulator 5, 15. It will be appreciated that $K=2^k$ where k is the number of more significant bits and that $M=2^m$ where m is the number of less significant bits in the less significant bits unit 15 of the accumulator which does not participate in the phase splitting.

Figure 2F:
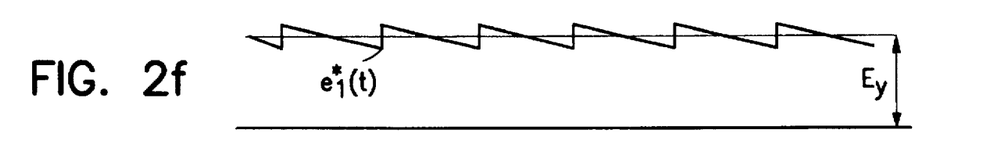

As mentioned above, each of the signals e(t) is given equal weight and thus the sum of these signals produces a constant $E_y=K \cdot e$, where $e=E_y/K$ is a constant component in each of the added signals e(t). The interference components $e_i(t)$ of each signal each have a starting period of q clock periods so that they are summed in such a way that an interference $e_i^*(t)$ having K times higher frequency, and K times lower amplitude results as shown in FIG. 2f. In actual practice, the constant components of the individual signals may differ from each other because of the presence, in some of them, of some constant increment to the duration of each pulse, due to a limited capacity of the pulse distributor 9. However, the fractional interferences make all the averaged values of the processes change in the same way.

Figure 2G:
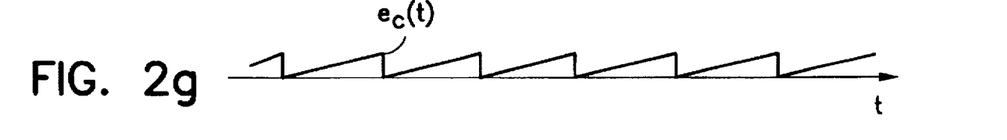

The period of the interference signal $e_i^*(t)$, which equals M clock periods, and the wave form of the interference, are determined by the less significant bits of the accumulator, which do not contribute to the phase-splitting process. The sum of the outputs of the less significant bits unit 15 of the accumulator 5, 15 is shown in FIG. 2g. It will be appreciated that this signal $e_c(t)$ is out-of-phase with the interference signal $e_i^*(t)$, and can be used to cancel out the remnant fractional interference.

Figure 3:
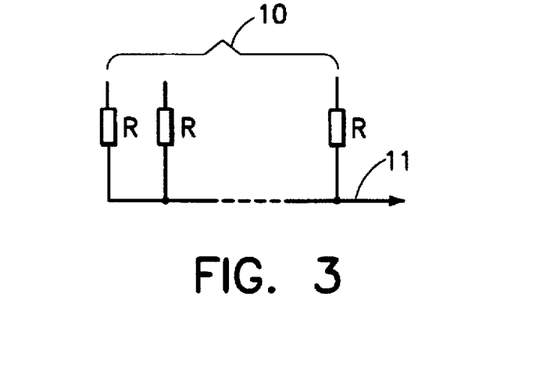
FIG. 3 is a schematic diagram of a KR resistive ladder embodiment of the DAC according to a first embodiment of the invention.
Figure 4:
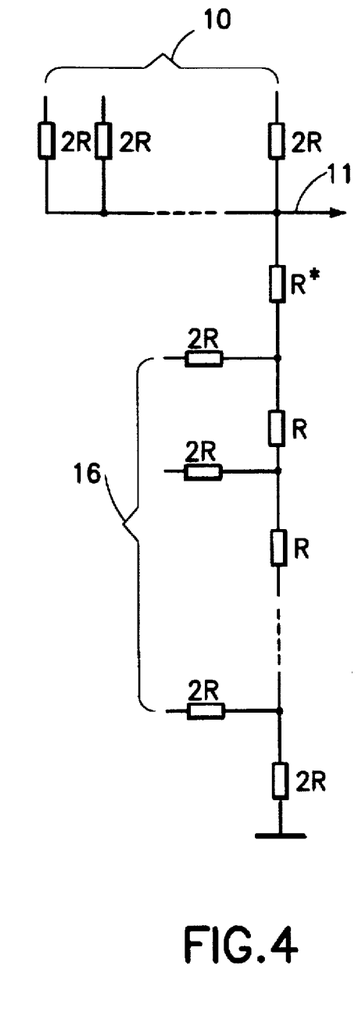
FIG. 4 is a schematic diagram of an embodiment of the DAC having a KR resistive ladder coupled to an R-2R resistive ladder.

From the foregoing, it will be appreciated that the summing of the e(t) signals produced by the RS flip-flops can be accomplished with a KR-type resistive ladder as shown in FIG. 3. Moreover, the sum of the less significant bits signal to form the canceling signal $e_c(t)$ can be accomplished with an R-2R-type resistive ladder such as seen in FIG. 4. As shown in FIG. 4, these two ladders are combined with the aid of matching resistor R*. If the resistors in the KR-type ladder are chosen to be 2R, then the matching resistor should be R.

Returning now to FIG. 1, it will be appreciated that the phase splitter 8 transmits $f_r$ pulses to the S-inputs of flip-flops 101 through 108 in a strictly defined sequence. As shown in FIG. 1, the number of bits k of the more significant bits accumulator unit 5 is k=3 so that K=8. If, for example, the code number X applied to the data bus 6 is such that the more significant bits portion $X_m=3$, then in one of the $f_r$ clock periods pulses arrive simultaneously at the S inputs of flip-flops 101 through 103. In the next clock period, pulses arrive simultaneously at the S inputs of flip-flops 104 trough 106; then, to flip-flops 107, 108, and 101; then, to flip-flops 102 through 104 and so on, in a circle. The carry from the less significant bits unit 15 to the more significant bits unit 5, if it arises on some of the clock periods, is equivalent to a unity increment of the $X_m$ number; hence, in this same clock period, the pulses arrive at four, instead of three, consecutive flip-flops.

Figure 5:
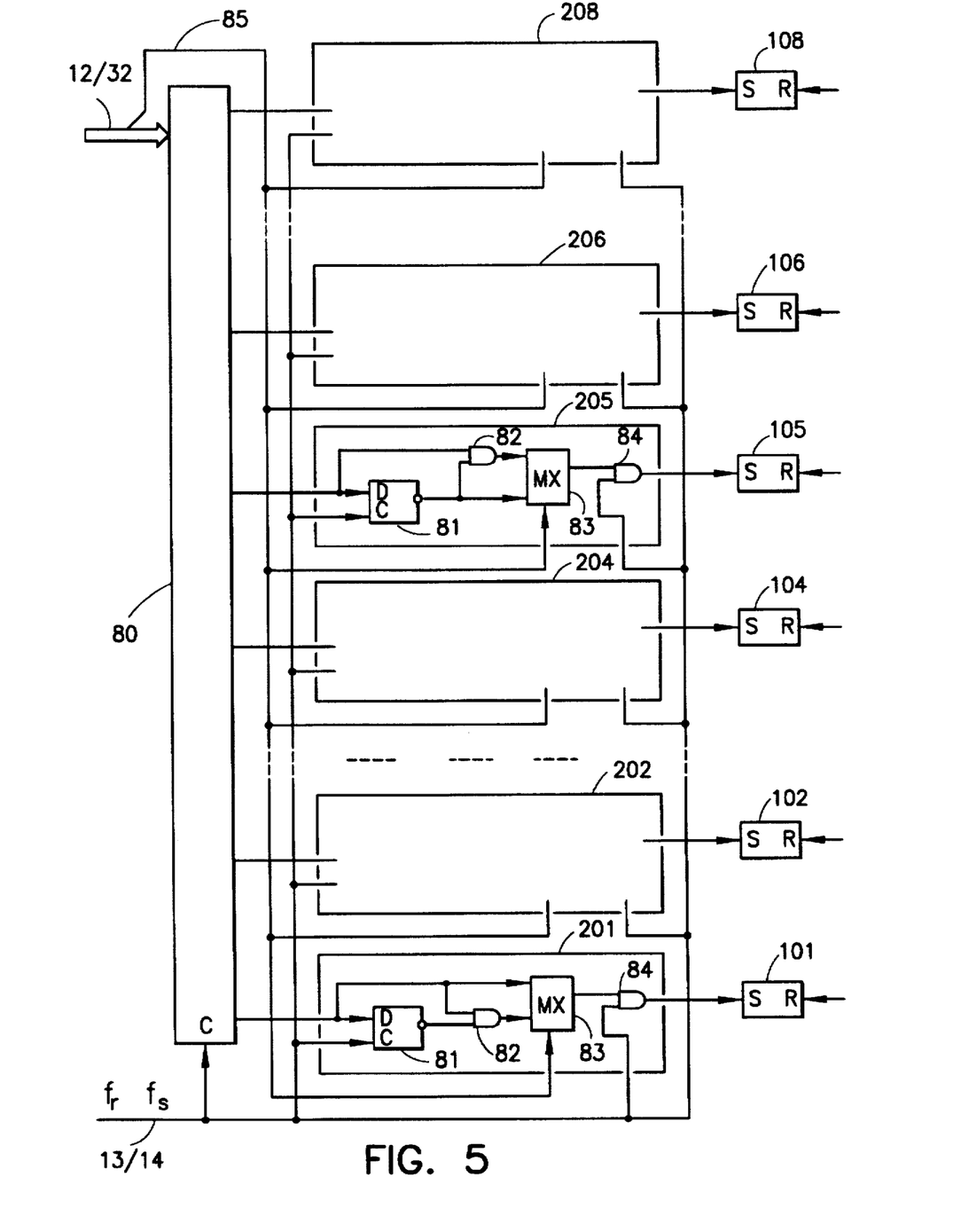
FIG. 5 is a schematic diagram of one embodiment of a phase splitter.

The phase splitter 8 may be constructed in many ways, the presently preferred construction being illustrated in FIG. 5. In this embodiment, the phase splitter includes a binary to linear transcoder 80 and K number of chains, e.g. 201–208. The transcoder 80 receives data input from the output bus 12 of the more significant bits accumulator 5, described above with reference to FIG. 1, and provides outputs to the chains as described below. The clock input C of the transcoder 80 is coupled to the clock bus 13 described above. Each of the chains, 201 through 208 in this example, is composed of a D-flip-flop 81, a first AND gate 82, a multiplexer 83 and a second AND gate 84, all connected in sequence. In each chain, the clock input C of the D flip-flop 81 and one of the inputs of the second AND gate 84 are coupled to the clock bus 13. The controlling input of the multiplexer 83 is coupled to an output of overflow pulses 85 which is part of the output bus 12 of the accumulator unit 5. In half of the chains, 201–204, representing the less significant bits of the code number $X_m$, the input of the chain is coupled to the D input of the flip-flop 81, an input of the first AND gate 82, and one of the inputs of the multiplexer 83. The output of the D flip-flop 81 is coupled to the other input of the first AND gate 82. The output of the first AND gate 82 is coupled to another input of the multiplexer 83, and the output of the multiplexer 83 is coupled to the other input of the second AND gate 84. The output of the second AND gate 84 is coupled to the S input of one of the RS flip-flops 101–108. The other half of the chains, 205–208, are constructed in substantially the same manner except that the first AND gate 82 is interposed between the input of the chain and the multiplexer 83 and the output of the D flip-flop 81 is coupled to one of the inputs of the first AND gate 82 and to one of the inputs of the multiplexer 83.

The phase splitter operates as follows: the transcoder 80 converts a binary code to a linear one, in which the number of ones produced on the outputs of the transcoder is equal to the numeric value of the binary code on the bus 12. The D flip-flops 81 store a previous linear code and the first AND gates 82 subtract the previous code from its current value. The resulting difference is transmitted via the multiplexers 83 to the second AND gates 84, which enable $f_r$ pulses to pass to the S inputs of corresponding RS flip-flops 101 through 108. The results of subtraction are used in all clock periods up to the full capacity of accumulator 5, and hence, of the transcoder 80. Up to this moment there is no overflow pulse on the control inputs of multiplexers 83 and each multiplexer passes an output signal of a respective first AND gate. As soon as the accumulator overflows, an overflow pulse on the control inputs of the multiplexers switches the outputs of first AND gates off the multiplexers. Simultaneously, in the chains 201 through 204, corresponding to less-significant bits of code number $X_m$, the multiplexers connect respective outputs of the transcoder, and in chains 205 through 208, respective outputs of the D-flip-flops. In order to start a next cycle of transcoder filling, it is necessary to provide rotation of $X_m$ ones (three ones in the above example) on outputs of the multiplexers, forming together a ring-like structure. Under control of the logic

7 level from the multiplexer output to the input of the second AND gate 84, an $f_r$ pulse is passed, or is not passed, to the S-input of a corresponding RS flip-flop.

Suppose that n=k, i.e. all bits of the accumulator are used to drive a phase splitter. Let's take for example n=3, x=3, and w=8. According to above-described action of the phase splitter, $f_r$ pulses appear on the S inputs of the RS flip-flops as shown in Table 1. In this table, "1" denotes a presence of a pulse on the S input of a corresponding flip-flop.

8

Figure 7:
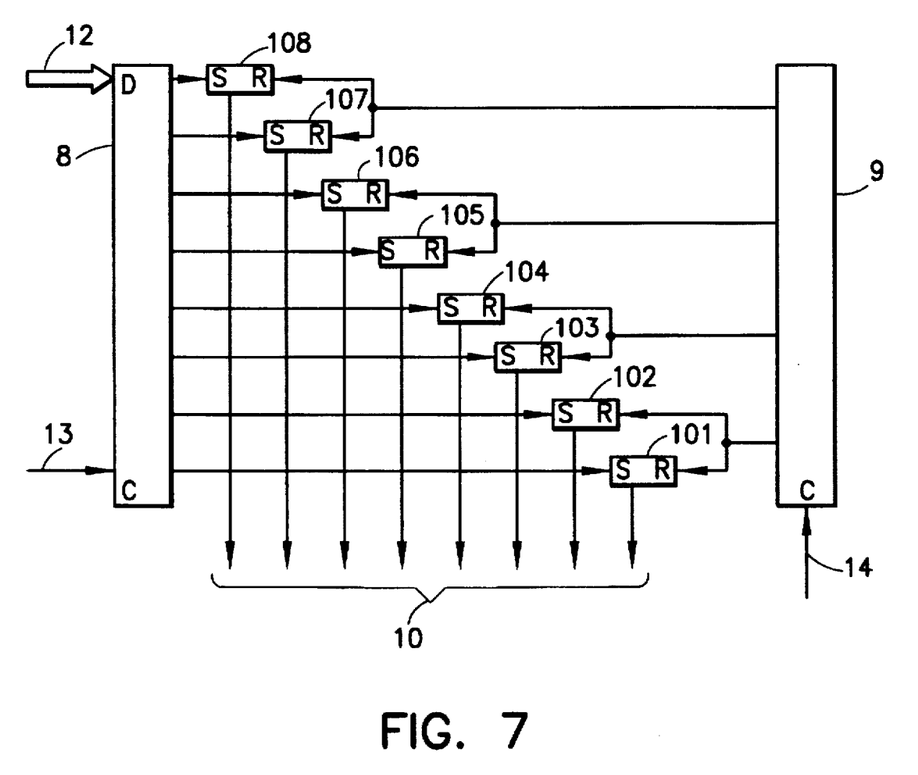
FIG. 7 is a block diagram showing the connection of a four output pulse distributor to eight RS flip-flops.

As mentioned above with reference to FIG. 1, the R inputs of the RS flip-flops 101–108 are coupled to the outputs of a pulse distributor 9. However, it is not necessary that the number of outputs of the pulse distributor be equal to the number of flip-flops. FIG. 7 shows how a pulse distributor 9 having only four outputs is coupled to pairs of flip-flops 101–102, 103–104, 105–106, and 107–108. In this embodiment, $f_s$ pulses will be applied to the R inputs of the pairs of flip-flops simultaneously. FIGS. 8a through 8e illustrate the inputs and outputs of the RS flip-flops when

TABLE I

| | No of Clock | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 ... |
| No. of flip flop, and presence of pulse on S-input | | | | | | | | | | | | | | |
| 1 | | 1 | | 1 | 1 | | | | 1 | | | | 1 | ... |
| 2 | 1 | 1 | | | 1 | | | 1 | | 1 | | | 1 | ... |
| 3 | 1 | | 1 | 1 | | | 1 | | | | 1 | | 1 | ... |
| 4 | 1 | | 1 | | 1 | 1 | | | 1 | | | | | ... |
| 5 | | 1 | | 1 | | 1 | | | 1 | 1 | | | | ... |
| 6 | | 1 | | | 1 | 1 | | | 1 | | 1 | | | ... |
| 7 | | 1 | | | 1 | | 1 | 1 | | | 1 | | | ... |
| 8 | | | 1 | | 1 | | 1 | | | 1 | 1 | | | ... |

As can be seen from Table 1, in each clock period, the pulses appear at the S inputs of three adjacent flip-flops, and each clock pulse shifts the pulses by three flip-flops, in ring-like cadence.

As mentioned above with reference to FIG. 1, the R inputs of the RS flip-flops 101–108 are coupled to the outputs of a pulse distributor 9. In the case where the pulse distributor 9 is a ring counter, in each clock period, an $f_s$ pulse appears at the R input of only one flip-flop, and a next clock shifts it to the next flip-flop.

Figure 6A:
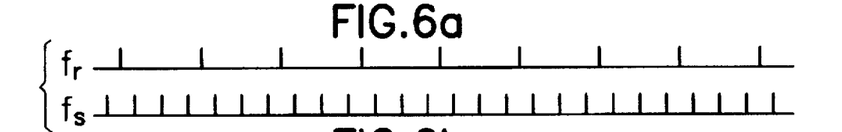
FIGS. 6a through 6e are timing diagrams illustrating the inputs and outputs of the RS flip-flops according to a first embodiment of the invention.
Figure 6B:
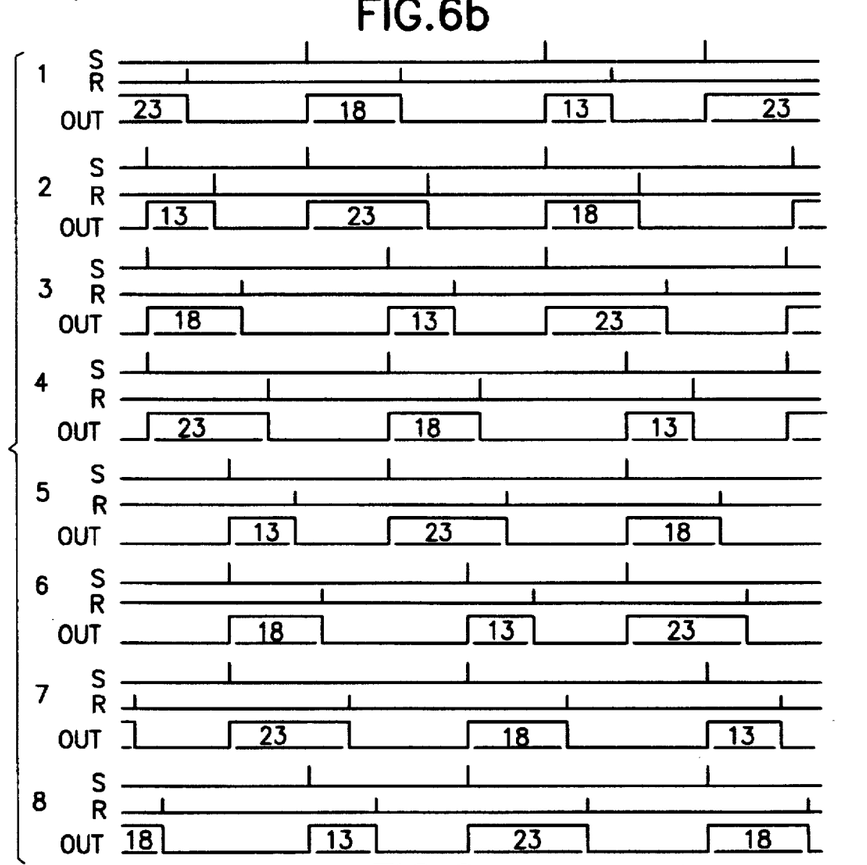
Figure 6C:
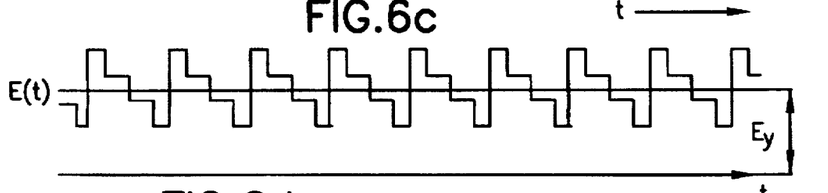
Figure 6D:
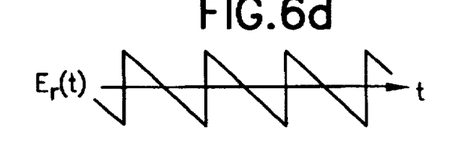
Figure 6E:
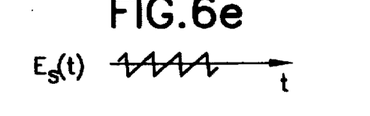

Turning now to FIGS. 6a through 6e, the inputs and outputs of the RS flip-flops are illustrated in a series of timing diagrams where the pulse widths are expressed in relative units and the vertical scale for the E(t) function assumes a unity weight of one data bit to a KR resistive ladder. FIG. 6a shows the clock pulses $f_r$ and $f_s$. As mentioned above, each of the output signals of the RS flip-flops summed by the KR resistive ladder has a fractional interference with a period of $q=2^n=8$ periods of $f_s$ pulses. The interference expresses itself as duty cycle modulation of flip-flop output pulses, the pulse widths being equal to 23, 18, and 13 relative units. As can be seen in FIG. 6b, the flip-flop output wave forms 1–8 are shifted in time with respect to each other by q/k=one period. The wave forms, delayed relative to the first one, go in the following sequence: 1, 4, 7, 2, 5, 8, and 6. Their sum, however, does not depend on their sequence. The sum function E(t), shown in FIG. 6c, contains a constant component $E_y$, and two saw-tooth periodic components $E_r(t)$ and $E_s(t)$ which are shown in FIGS. 6d and 6e respectively. There is no fractional interference in this process, or function. The constant component $E_y$, which is proportional to an equivalent phase shift of $f_r$ and $f_s$ pulses, is passed via low-pass filter 2 (FIG. 1), to the controlling input of the controllable oscillator 3 (FIG. 1), while the high-frequency components $E_r(t)$ and $E_s(t)$ are easily filtered out. From the foregoing, those skilled in the art will appreciate that the phase splitting of the accumulator bits does not generate any fractional interference and there is thus no need for circuits to suppress such interference. Moreover, the remnant fractional interference has a period, expressed in number of $f_r$ pulses, of $M=2^m=2^0=1$.

coupled to the pulse distributor according to FIG. 7 and the accumulator is 3-bit, n=k=3.

Figure 8A:
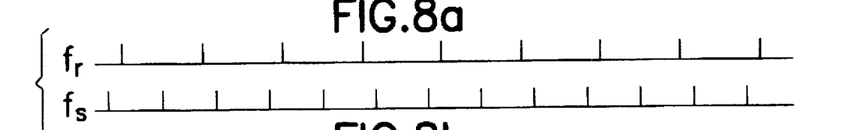
FIGS. 8a–8e are timing diagrams illustrating the inputs and outputs of the RS flip-flops according to a second embodiment of the invention.
Figure 8B:
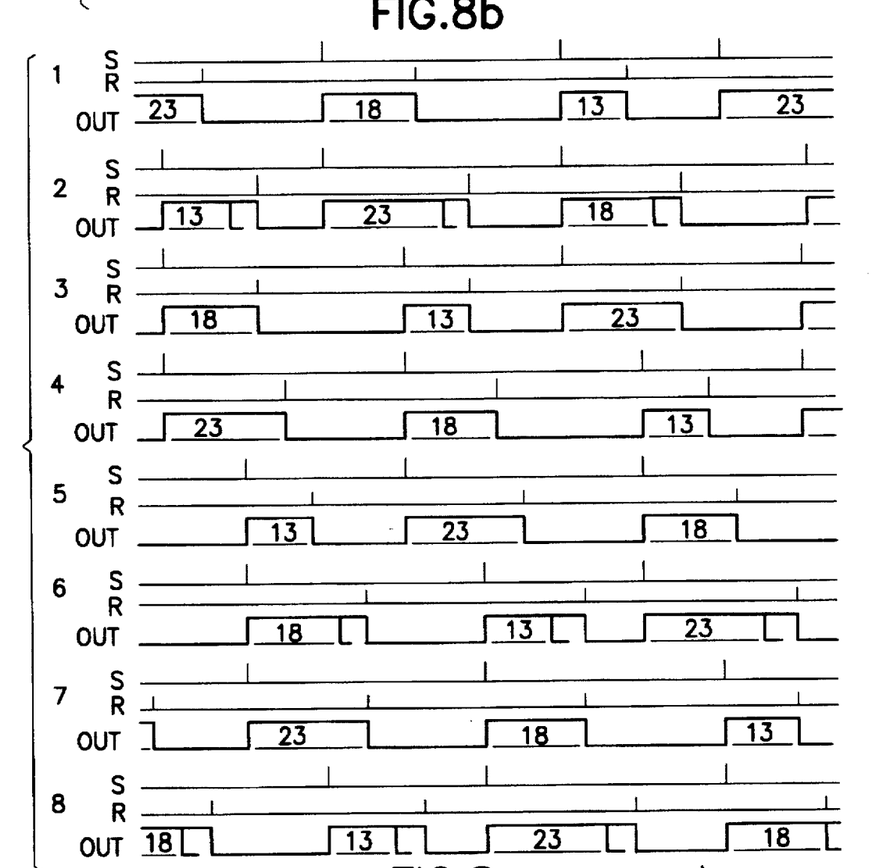
Figure 8C:
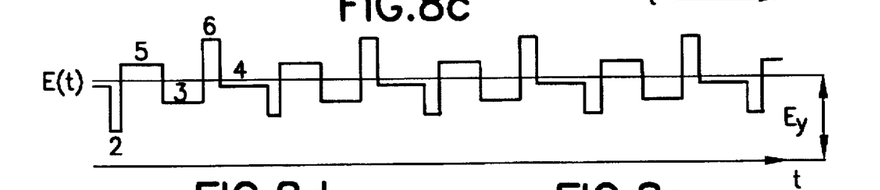
Figure 8D:
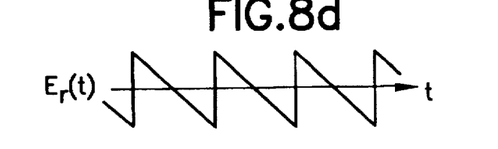
Figure 8E:
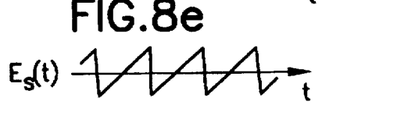

Comparing FIGS. 6b and 8b, it will be seen that each of the pulse widths of the outputs of the even numbered flip-flops are extended by five relative units, i.e. half the period of the $f_s$ pulses. As seen in FIGS. 8c and 8d, this change does not change the wave form or amplitude of the fractional interference.

Based on the above comparison, it will be understood that in the case of a pulse distributor having only two outputs (w=2), the pulse increments in each group of 4 flip-flops are ¾, ½, ¼ and 0 parts of the $f_s$ pulse period, respectively, in each flip-flop.

The examples discussed above with reference to FIGS. 6a through 8e, concern a three bit accumulator, i.e. where n=k=3. However, as mentioned above, the accumulator may be more, for example, a five bit accumulator with n=5, k=3 and m=2. Here, the two less significant bits (m=2) are used to generate a cancelling function $e_c(t)$. Taking, for example, an implementation of the invention with a five bit accumulator and a pulse distributor having a capacity w=4, with an input number X=13, (meaning that the input of the three more significant bit accumulator $x_m=3$ and the input of the less significant bit accumulator gets a number $x_L=1$) the presence of $f_r$ pulses on the S inputs of the flip-flops is shown below in Table 2. As seen in Table 2, as the clock $f_r$ pulses, the less significant bits accumulator (15 in FIG. 1) produces an output $x_L(t)$ which cycles from 1 through 3 and overflows to 0.

5,748,043

TABLE 2

| Number of Clock | 1 | 2 | 3 | 4 | 5 | 6 | 7 | 8 | 9 | 10 | 11 | 12 | 13 | 14 | ... |
|---|---|---|---|---|---|---|---|---|---|---|---|---|---|---|---|
| $x_L$ (t) | 1 | 2 | 3 | 0 | 1 | 2 | 3 | 0 | 1 | 2 | 3 | 0 | 1 | 2 | ... |
| No. of flip flop, and presence of pulse on S-input | | | | | | | | | | | | | | | |
| 1 | | | 1 | | 1 | | | 1 | | 1 | | | 1 | | ... |
| 2 | 1 | | 1 | | | 1 | | 1 | | | 1 | | 1 | | ... |
| 3 | 1 | | | 1 | | 1 | | 1 | | | 1 | | 1 | | ... |
| 4 | 1 | | | 1 | | 1 | | | 1 | | 1 | | | 1 | ... |
| 5 | | 1 | | 1 | | | 1 | | 1 | | | 1 | | 1 | ... |
| 6 | | 1 | | 1 | | | 1 | | 1 | | | 1 | | 1 | ... |
| 7 | | 1 | | | 1 | | 1 | | | 1 | | 1 | | | ... |
| 8 | | | 1 | | 1 | | | 1 | | 1 | | 1 | | | ... |

Figure 9A:
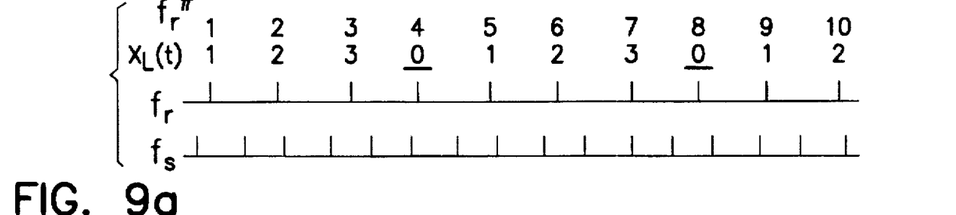
FIGS. 9a–9e are timing diagrams illustrating the inputs and outputs of the RS flip-flops according to a third embodiment of the invention.
Figure 9B:
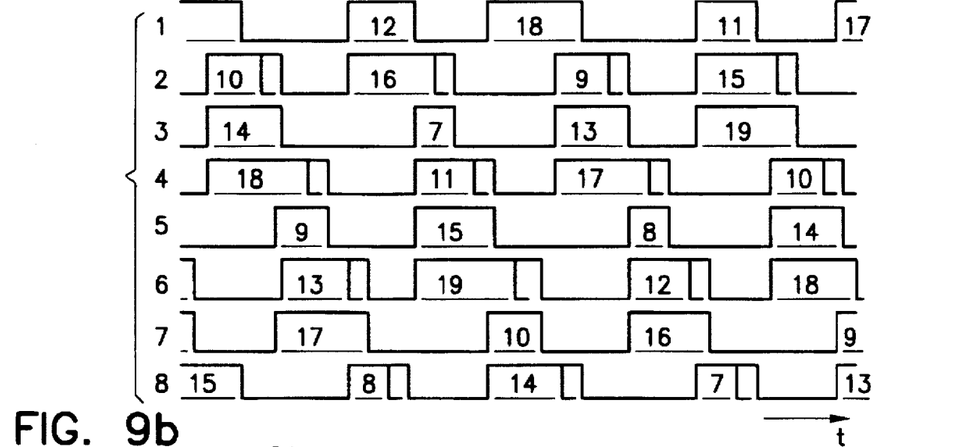
Figure 9C:
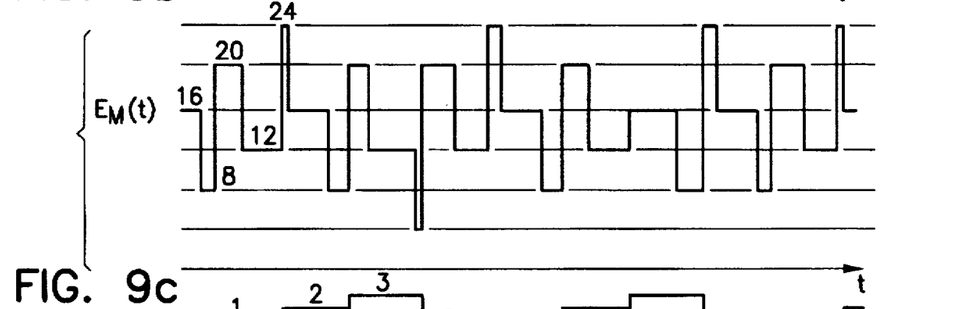
Figures 9D, 9E:
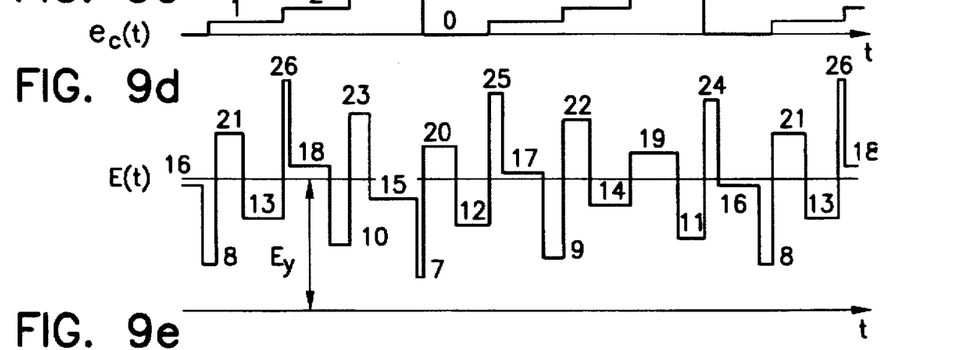

At the overflow of less-significant bits of the accumulator, an overflow pulse goes to the more-significant bits of the accumulator, and the number of "ones" in a corresponding column of Table 2 increments by one, i.e. four flip-flops switch over simultaneously, instead of three and the next $f_s$ pulse goes to two adjacent flip-flops simultaneously. FIGS. 9a through 9e show the timing diagrams associated with this embodiment of the invention. FIG. 9a shows that with every fourth pulse of the clock signal $f_r$, the less significant bits accumulator overflows according to the function $x_L(t)$. The output of each of the eight flip-flops is shown in FIG. 9b, and $E_M(t)$ denotes the sum of the outputs of the flip-flop s according to the portion 10 of the resistive ladder shown in FIG. 4. Each output of the flip-flops has a fractional interference with a period of $q=2^n=2^5=32$ clock periods of $f_r$ pulses. Flip-flop switch-overs are shifted in time by $q/K=M=4$ of clock periods, with respect to each other. It will be recalled, however, that the portion 16 of the resistive ladder in FIG. 4 also adds the output of the less significant bits accumulator and this sum is shown in FIG. 9d as the function $e_c(t)$. The sum $E(t)$ of the process $E_M(t)$ and of the canceling signal $e_c(t)$ may be considered as a sum of the controlling signal $E_y$ and of two periodic saw-tooth functions $E_r(t)$ and $E_s(t)$, having frequencies $f_r$ and $f_s$ respectively (FIGS. 6d and 6e), which can be filtered out by the low-pass filter.

Figure 10:
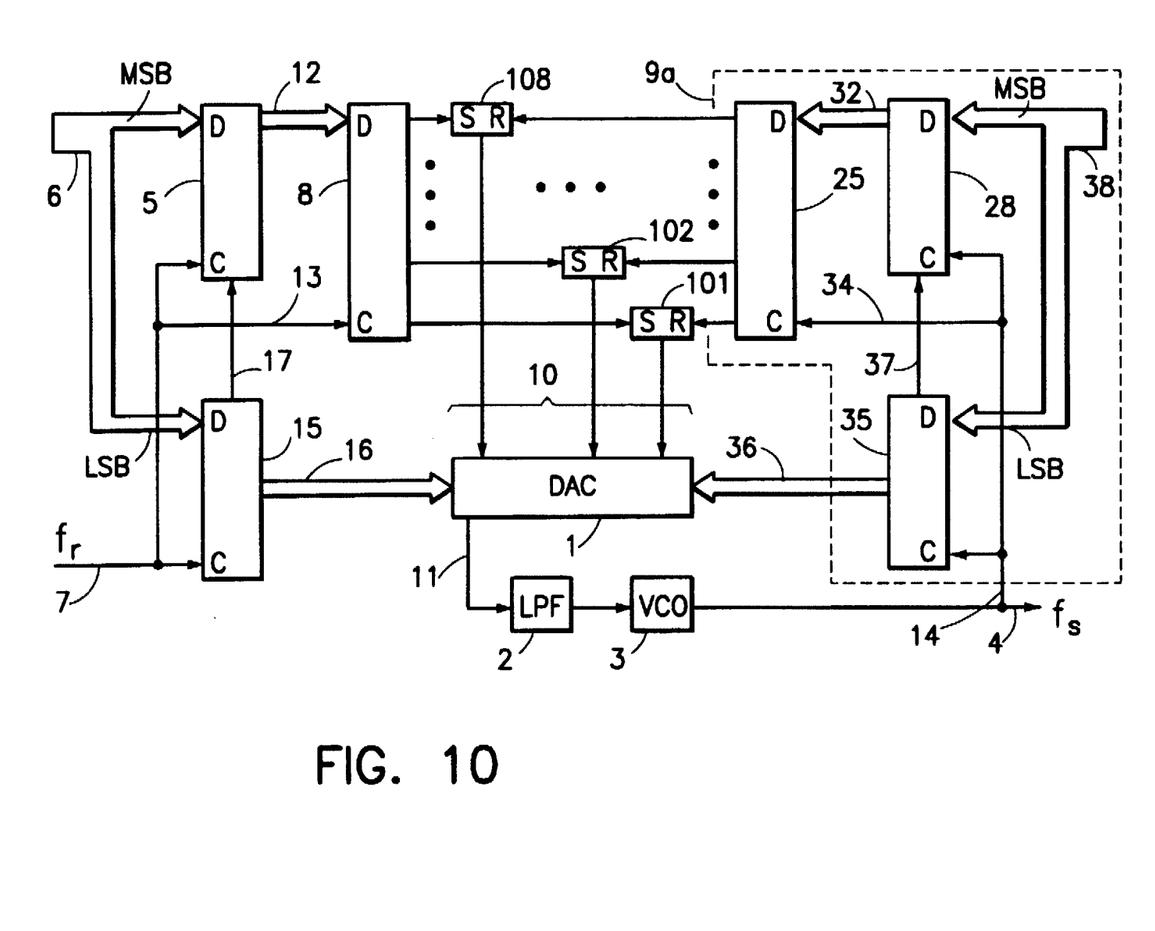
FIG. 10 is a view similar to FIG. 1, but of a fourth embodiment of the invention.
Figure 11:
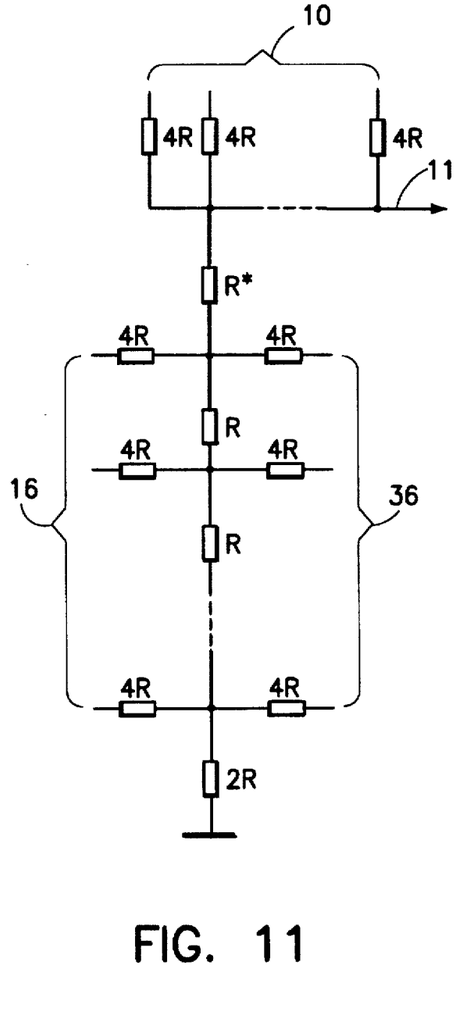
FIG. 11 is a schematic diagram of an embodiment of the DAC having a KR resistive ladder coupled to an R-4R/2 resistive ladder.

In yet another embodiment of the invention as shown in FIG. 10, the pulse distributor 9a shown in FIG. 1 may be constructed as a second accumulator unit and phase splitter. According to this embodiment, the pulse distributor 9 includes a second accumulator 28, 35 having a more significant bits portion 28 and a less significant bits portion 35 coupled by a carry network 37 and a second phase splitter 25. These units are coupled to each other in a manner similar to the units 5, 15, and 8 described above with reference to FIG. 1. A second data bus 38 provides input to the accumulator 28, 35. The output of the more significant bits portion 28 provides input for the phase splitter 25, and the clock inputs C of the units are coupled via a clock bus 14 to the $f_s$ output 4 of the controllable oscillator 3. The coupling of the output 36 of the less significant bits portion 35 of the accumulator 28, 35 to the DAC 1 is shown in FIG. 11. Here the DAC 1 is formed as a KR & R-4R/2 resistive ladder having inputs 10, 16, and 36. In this embodiment of the invention, the numbers present on the first and second data buses 6, 38 relate to the first equation given above $f_s=(a/b) \cdot f_r$ where a is the number on the first data bus 6 and b is the number on the second data bus 38.

Figure 12:
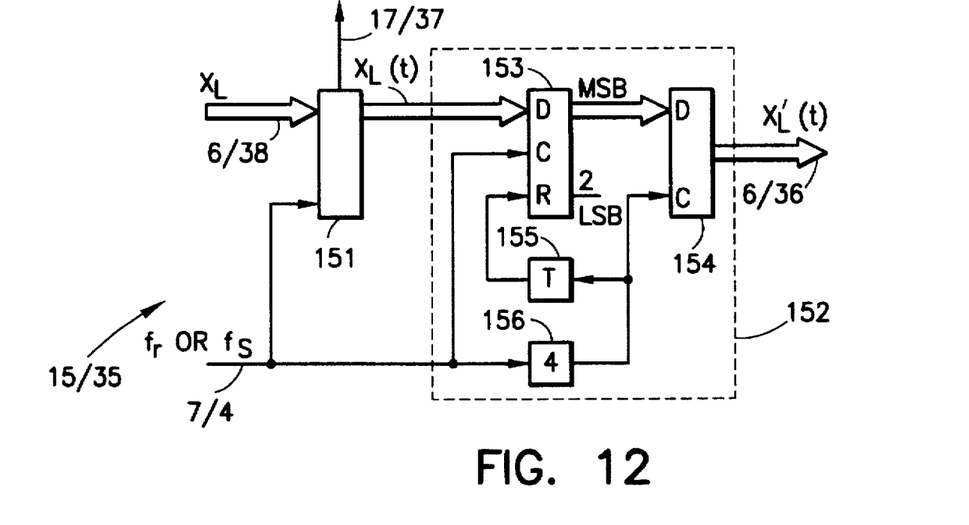
FIG. 12 is a schematic diagram of one embodiment of a less significant bits portion of the first and second accumulators.

In still another embodiment of the invention as shown in FIG. 12, the less significant bits portions 15 and 35 of the first and second accumulators shown in FIGS. 1 and 10 is constructed as a primary accumulator 151 and an averaging unit 152 which are both clocked by reference or output signal pulses received from bus 7 or 4 corresponding to respective portions 15 or 35. The control LSB code XL is fed to the D input of the primary accumulator 151 from the corresponding data bus 6 or 38. The respective overflow output 17 or 37 of primary accumulator 151 is coupled to the respective carry network mentioned above.

The averaging unit 152 includes an averaging accumulator 153, having a D input which is coupled to the output of the primary accumulator 151, a register 154, having a D input which is coupled to the output of the averaging accumulator 153, a delay circuit 155 and a frequency divider 156. The averaging accumulator 153 is clocked by the same bus 7 or 4 as the primary accumulator 151 and the register 154 is clocked by divided pulses supplied by the frequency divider 156 which receives input from the respective clock bus 7 or 4. The delay circuit 155 also receives the divided pulses from the frequency divider 156 and provides delayed pulses to the R input of the averaging accumulator 153 to set it to a zero state. The averaging unit 152 serves to average the cancelling digital signal XL(t) from the output of the primary accumulator 151 for some clock cycles, e.g. for P=4 clock cycles. To do this, the accumulator 153 has m+p bits, where $p=\log_2 P$, e.g. p=2 when P=4. The m-bit process $X_L(t)$ is applied to the m less significant bits of the D input of the accumulator 153 and a sum formed on the m more significant bits output of the accumulator 153 is the average value for $P=2^p$ clock cycles (the output of p less significant bits is not used). The average value from the accumulator 153 is written into the register 154 and the accumulator 153 is returned to its initial zero state to begin another averaging. This process is repeated every P clock cycles because the frequency divider 156 is set to divide the lock cycles on bus 7 or 4 by P. The delay value in the delay circuit 155 is set to allow enough time to write the output of the accumulator 153 into the register 154 before the accumulator 153 is returned to zero state.

Figure 13A:
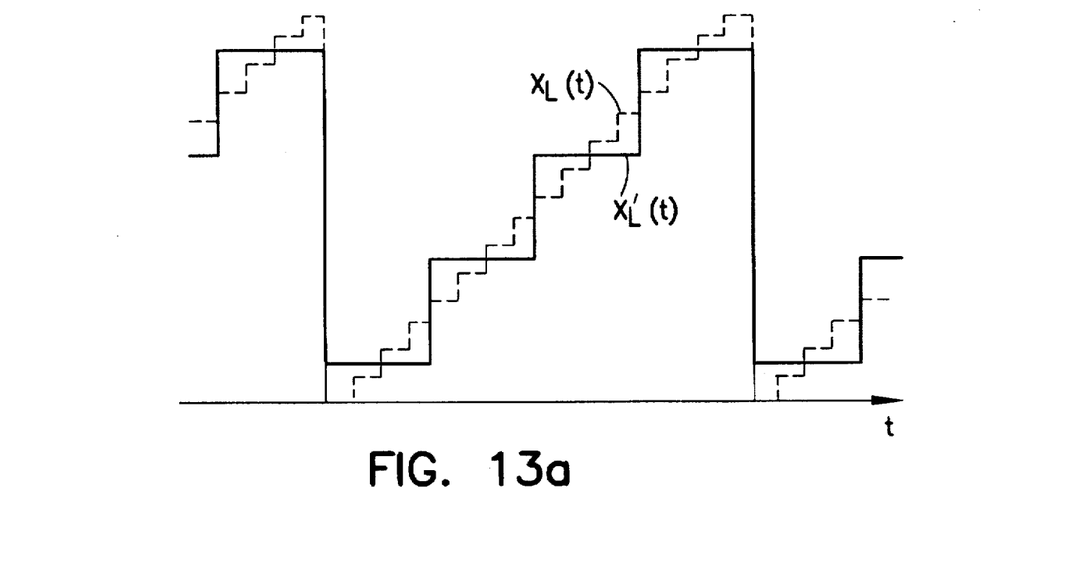
FIGS. 13a and 13b are timing diagrams illustrating the outputs of the less significant bits portions of FIG. 12.
Figure 13B:
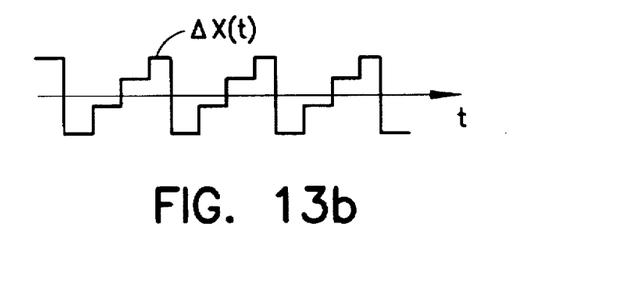

Referring now to FIGS. 12, 13a and 13b, the difference $\Delta X(t)$ between the initial digital process $X_L(t)$ on the bus 6 or 38 and the averaged process $X_L'(t)$ on the bus 16 or 36 is a periodic function having a period of P clock cycles. An analog equivalent of this difference is an interference which can be filtered by the low pass filter just as the pulses of the RS flip-flops switching having approximately the same period q/x clock cycles.

There have been described and illustrated herein several embodiments of a digital frequency synthesizer. While particular embodiments of the invention have been described, it is not intended that the invention be limited thereto, as it is intended that the invention be as broad in scope as the art will allow and that the specification be read likewise. Thus, while particular implementations of the DAC have been disclosed, it will be appreciated that other implementations could be utilized. Also, while particular embodiments of the phase splitters and pulse distributors have been shown, it will be recognized that other types of phase splitters and pulse distributors could be used with similar results obtained. Moreover, while particular configurations have been disclosed in reference to the number of bits in the accumulators, it will be appreciated that other accumulators having different capacities could be used as well. It will therefore be appreciated by those skilled in the art that yet other modifications could be made to the provided invention without deviating from its spirit and scope as so claimed.

What is claimed is:

1. A frequency synthesizer, comprising:
a) a digital to analog converter having a first plurality of digital inputs and an analog output;
b) a low pass filter having an input and an output, said analog output of said digital to analog converter being coupled to said input of said low pass filter;
c) a controllable oscillator having an input and an output, said output of said low pass filter being coupled to said input of said controllable oscillator, and the output of the controllable oscillator being the output of said frequency synthesizer;
d) a first accumulator having a data input, a data output, and a clock input, said data input coupled to a first data bus and said clock input coupled to a reference clock;
e) a first phase splitter having a data input, a plurality of outputs, and a clock input, said data input being coupled to said data output of said first accumulator and said clock input being coupled to said reference clock;
f) K number of RS flip-flops, each having an S input, an R input, and an output, each of said K number of RS flip-flops being coupled by its S input to a respective one of said plurality of outputs of said phase splitter, and each of said K number of RS flip-flops being coupled by its output to a respective one of said first plurality of digital inputs of said digital to analog converter;
g) a pulse distributor having a clock input said clock input being coupled to said output of said controllable oscillators and W number of outputs each being coupled to the R input of a respective K/W number of flip-flops, where K/W is an integer.

2. A frequency synthesizer according to claim 1, wherein: K=W.

3. A frequency synthesizer according to claim 1, wherein: said pulse distributor is a ring counter.

4. A frequency synthesizer according to claim 1, wherein: said first accumulator has a more significant bits portion and a less significant bits portion coupled to each other by a carry network, the outputs of said more significant bits portion being coupled to said first phase splitter.

5. A frequency synthesizer according to claim 4, wherein: said digital to analog converter has a second plurality of digital inputs, and the outputs of said less significant bits portion are coupled to said second plurality of digital inputs of said digital to analog converter.

6. A frequency synthesizer according to claim 1, wherein said pulse distributor comprises:
a second accumulator having a data input, a data output, and a clock input, said data input coupled to a second data bus and said clock input coupled to said output of said controllable oscillator; and a second phase splitter having a data input, a plurality of outputs, and a clock input, said data input being coupled to said data output of said second accumulator and said clock input being coupled to said output of said controllable oscillator, said plurality of outputs of said phase splitter being outputs of said pulse distributor.

7. A frequency synthesizer according to claim 6, wherein: said second accumulator has a more significant bits portion and a less significant bits portion coupled to each other by a carry network, the outputs of said more significant bits portion being coupled to said second phase splitter.

8. A frequency synthesizer according to claim 7, wherein: said digital to analog converter has a third plurality of digital inputs, and the outputs of said less significant bits portion being coupled to said third plurality of digital inputs of said digital to analog converter.

9. A frequency synthesizer according to claim 1, wherein: said first plurality of digital inputs are constructed as a KR-type resistive ladder.

10. A frequency synthesizer according to claim 5, wherein:
said first plurality of digital inputs are constructed as a KR-type resistive ladder, and
said second plurality of digital inputs are constructed as an R-2R resistive ladder.

11. A frequency synthesizer according to claim 8, wherein:
said first plurality of digital inputs are constructed as a KR-type resistive ladder, and
said second and third plurality of digital inputs are constructed as R-4R resistive ladders.

12. A frequency synthesizer according to claim 1, wherein said first phase splitter comprises:
a transcoder having K number of outputs, K being an even number, a first K/2 number of outputs corresponding to less significant bits and a second K/2 outputs corresponding to more significant bits;
K number of chains, each of said chains comprising a D-flip-flop having a D input, a C input and an output, a first AND gate having two inputs and an output, a multiplexer having two data inputs, a control input, and an output and a second AND gate having two inputs and an output,
said reference clock being coupled to the C input of each D flip-flop, and one of the inputs of each second AND gate,
an overflow output of said data output of said first accumulator being coupled to the control input of each multiplexer,
each respective one of said first K/2 outputs being coupled to the D input of a respective D flip-flop, an input of a respective first AND gate and an input of a respective multiplexer, the output of the D flip-flop being coupled to another input of the first AND gate, the output of the first AND gate being coupled to another input of the multiplexer, the output of the multiplexer being coupled to an input of a respective second AND gate, the output of the second AND gate being an output of said first phase splitter, and
each respective one of said second K/2 outputs being coupled to the D input of a respective D flip-flop and an input of a respective first AND gate, the output of the D flip-flop being coupled to another input of the first AND gate and an input of a respective multiplexer, the output of the first AND gate being coupled to another input of the multiplexer, the output of the multiplexer being coupled to an input of a respective second AND gate, the output of the second AND gate being an output of said first phase splitter.

13. A frequency synthesizer according to claim 6, wherein said second phase splitter comprises:

a transcoder having K number of outputs, K being an even number, a first K/2 number of outputs corresponding to less significant bits and a second K/2 outputs corresponding to more significant bits;

K number of chains, each of said chains comprising a D-flip-flop having a D input, a C input and an output, a first AND gate having two inputs and an output, a multiplexer having two data inputs, a control input, and an output and a second AND gate having two inputs and an output, said output of said controllable oscillator being coupled to the C input of each D flip-flop, and one of the inputs of each second AND gate, an overflow output of said data output of said second accumulator being coupled to the control input of each multiplexer, each respective one of said first K/2 outputs being coupled to the D input of a respective D flip-flop, an input of a respective first AND gate and an input of a respective multiplexer, the output of the D flip-flop being coupled to another input of the first AND gate, the output of the first AND gate being coupled to another input of the multiplexer, the output of the multiplexer being coupled to an input of a respective second AND gate, the output of the second AND gate being an output of said second phase splitter, and each respective one of said second K/2 outputs being coupled to the D input of a respective D flip-flop and an input of a respective first AND gate, the output of the D flip-flop being coupled to another input of the first AND gate and an input of a respective multiplexer, the output of the first AND gate being coupled to another input of the multiplexer, the output of the multiplexer being coupled to an input of a respective second AND gate, the output of the second AND gate being an output of said second phase splitter.

14. A frequency synthesizer according to claim 5, wherein said less significant bits portion of said first accumulator comprises:

i) a primary accumulator having a D input, a C input, an output, and an overflow output;

ii) an averaging unit having a D input, a C input, and an output;

said reference clock being coupled to said C input of said primary accumulator and said C input of said averaging unit;

said first data bus being coupled to said D input of said primary accumulator;

said output of said primary accumulator being coupled to said D input of said averaging unit;

said overflow output of said primary accumulator being coupled to said carry network; and said output of said averaging unit being coupled to said second plurality of digital inputs of said digital to analog converter.

15. A frequency synthesizer according to claim 14, wherein said averaging unit comprises:

i) an averaging accumulator having a capacity of p bits more than said primary accumulator, a less significant bits D input coupled to said output of said primary accumulator, a C input coupled to said reference clock, an R input, and a more significant bits output;

ii) a register having a D input coupled to said more significant bits output of said averaging accumulator, an output coupled to said second plurality of digital inputs of said digital to analog converter, and a C input;

iii) a delay circuit having an input and an output coupled to said R input of said averaging accumulator; and iv) a frequency divider having an input coupled to said reference clock and an output coupled to said C input of said register and to said input of said delay circuit.

16. A frequency synthesizer according to claim 8, wherein said less significant bits portion of said second accumulator comprises:

i) a primary accumulator having a D input, a C input, an output, and an overflow output;

ii) an averaging unit having a D input, a C input, and an output;

said output of said controllable oscillator being coupled to said C input of said primary accumulator and said C input of said averaging unit;

said second data bus being coupled to said D input of said primary accumulator;

said output of said primary accumulator being coupled to said D input of said averaging unit;

said overflow output of said primary accumulator being coupled to said carry network of said second accumulator; and said output of said averaging unit being coupled to said third plurality of digital inputs of said digital to analog converter.

17. A frequency synthesizer according to claim 16, wherein said averaging unit comprises:

i) an averaging accumulator having a capacity of p bits more than said primary accumulator, a less significant bits D input coupled to said output of said primary accumulator, a C input coupled to said output of said controllable oscillator, an R input, and a more significant bits output;

ii) a register having a D input coupled to said more significant bits output of said averaging accumulator, an output coupled to said third plurality of digital inputs of said digital to analog converter, and a C input;

iii) a delay circuit having an input and an output coupled to said R input of said averaging accumulator; and iv) a frequency divider having an input coupled to said output of said controllable oscillator and an output coupled to said C input of said register and to said input of said delay circuit.

18. A frequency synthesizer according to claim 15, wherein:

said frequency divider has a ratio of 1:2P.

19. A frequency synthesizer according to claim 17, wherein:

said frequency divider has a ratio of 1:2P.

* * * * *